United States Patent

[11] 3,585,410

[72] Inventor Richard D. Burtness
Little Silver, N.J.
[21] Appl. No. 792,944
[22] Filed Jan. 22, 1969
[45] Patented June 15, 1971
[73] Assignee Bell Telephone Laboratories, Incorporated
Murray Hill, Berkeley Heights, N.J.

[54] MASTER-SLAVE J-K FLIP FLOP
8 Claims, 3 Drawing Figs.

[52] U.S. Cl. .......... 307/291,
307/247, 307/292, 328/194
[51] Int. Cl. .......... H03k 3/26
[50] Field of Search .......... 307/291,
289, 292, 247; 328/194

[56] References Cited

UNITED STATES PATENTS

| | | | |
|---|---|---|---|
| 3,177,374 | 4/1965 | Simonian .......... | 307/247 |
| 3,401,273 | 9/1968 | May .......... | 307/247 |
| 3,430,020 | 2/1969 | Marshall .......... | 307/247 |
| 3,440,449 | 4/1969 | Priel .......... | 307/291 |

OTHER REFERENCES

Taft, Van Ligten, & Longo,– "Microelectronics, High Level Transistor Logic Flip-flops" pp. 176 & 177, FIGS. 1 & 4 Nov. 1965, NEREM RECORD.

*Primary Examiner*—Donald D. Forrer
*Assistant Examiner*—David M. Carter
*Attorneys*—R. J. Guenther and William L. Keefauver

ABSTRACT: A J-K master-slave flip-flop having improved internal propagation and drive characteristics is realized in monolithic integrated form. Improved internal signal propagation is achieved by utilizing current steering to control slave switching. Drive requirements are minimized by using input gates which are fabricated on the monolithic chip.

PATENTED JUN 15 1971

3,585,410

INVENTOR
R.D. BURTNESS
BY G. E. Hirsch Jr.
ATTORNEY

MASTER-SLAVE J-K FLIP FLOP

This invention relates to bistable logic circuits and, more particularly, to J-K master-slave flip-flops.

BACKGROUND OF THE INVENTION

In digital equipment, for example, data processors, telephone systems, and the like, shift registers, binary counters, binary frequency dividers, and the like, are utilized. Many types of bistable networks have been developed to fulfill these functions. Typical among the developed networks is the J-K master-slave flip-flop. Because of its versatility and its adaptability to integrated circuitry, the J-K master-slave flip-flop has been advantageously employed to simplify system complexity.

Although master-slave flip-flops are well known in the art, problems arise in the their use because of system requirements. These requirements generally dictate a circuit configuration which, in turn, may restrain, for example, flip-flop switching speed.

SUMMARY OF THE INVENTION

These and other problems are resolved in a bistable circuit which includes a master flip-flop section and a slave flip-flop secton. Signal transfer from the master flip-flop to the slave flip-flop and switching of the slave flip-flop from the bistable state to another is achieved in accordance with the inventive principles described herein by selectively "steering" current to individual ones of the switching transistors forming the slave flip-flop.

More specifically, switching of the slave flip-flop from a first stable state to a second stable state is achieved by utilizing signal controlled "current steering" transistor pairs in conjunction with the slave flip-flop switching transistors and a controllable gate. Application of signals in a selected code to one transistor of each current steering pair and to the gate regulates conduction of the other transistors of the current steering pairs, and consequently the conduction of the associated flip-flop switching transistors. The current steering transistors pairs enhance switching speed of the slave flip-flop, in accordance with the invention, by selectively draining excess charge from the base of the flip-flop switching transistor which is turning off, thereby causing that transistor to turn off more rapidly.

Additionally, in fabricating the circuit of this invention in integrated form, space is saved on the monolithic chip by utilizing a dual transistor structure having a single collector region which occupies a single isolation region for the current steering transistor pairs. This additional space is advantageously utilized in the fabrication of input gates on the monolithic chip which, in turn, lower input drive requirements of the master-slave flip-flop of this invention.

These and other objects and advantages will be more fully understood from the following detailed description of an illustrative embodiment thereof taken in connection with the appended drawings.

BRIEF DESCRIPTION

DETAILED DESCRIPTION

Figure 1:
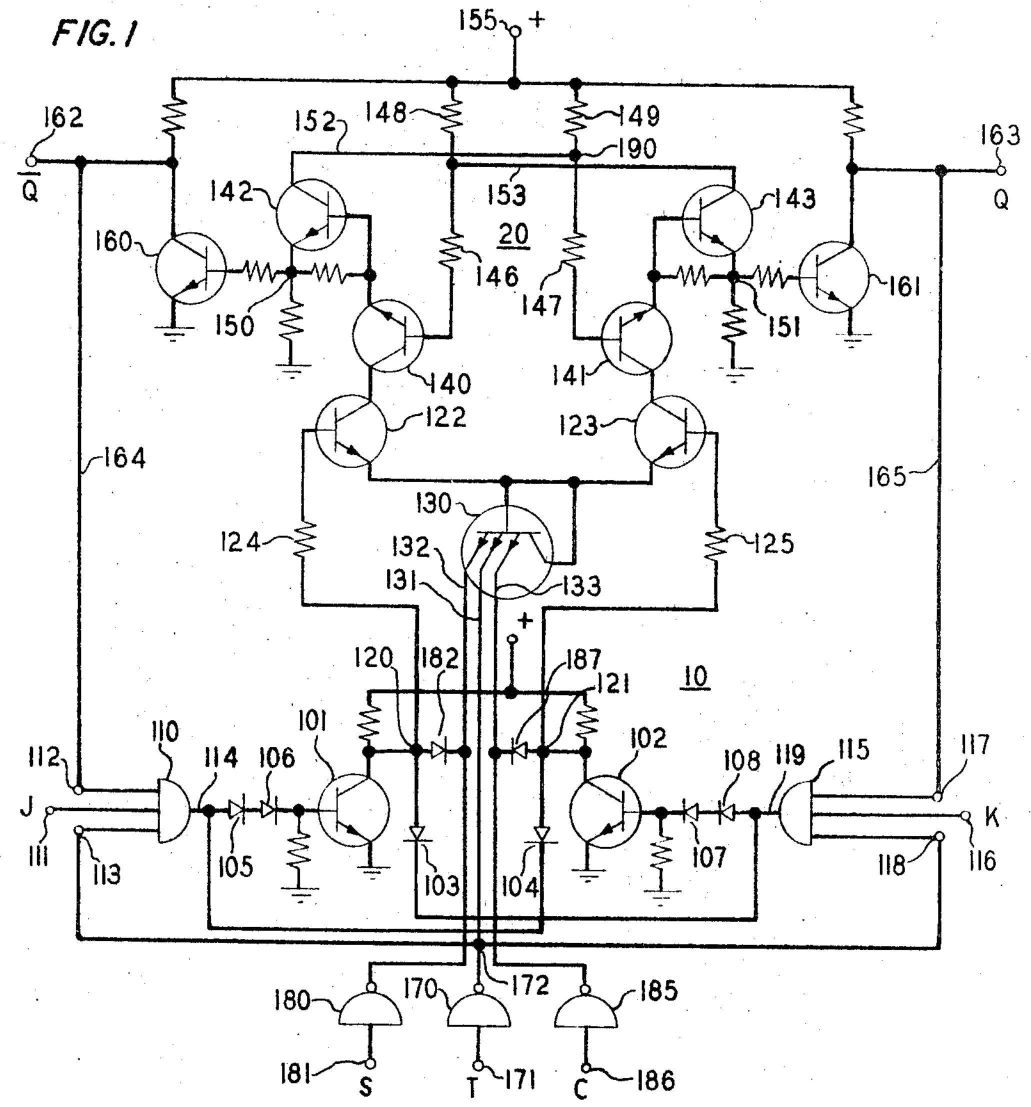
FIG. 1 is a schematic diagram of a flip-flop circuit illustrating the invention.

FIG. 1 illustrates a J-K master-slave flip-flop which utilizes the principles of this invention. For J-K operation, i.e., "-clocked" mode, signals are supplied to J and K inputs 111 and 116, respectively. These signals are read into master flip-flop 10 in well-known fashion, and are subsequently transferred to slave flip-flop 20 by application of appropriate signal to the "-toggle" (sometimes called "clock") input 171. For set of clear operation, i.e., "asynchronous" mode, selected signals are supplied to set and clear inputs 181 and 186, respectively. The set and clear signals dominate all other inputs causing the master and slave flip-flops to switch to predetermined states. "Synchronous"mode operation is achieved by application of appropriate signals to the J, K, S, and C inputs and thereafter applying an appropriate toggle signal to the clock input. These modes of operation, namely, clocked J-K, asynchronous, and synchronous, are described later in conjunction with Tables I, II and III, respectively.

Transistors 101 and 102 of FIG. 1 form a typical master flip-flop 10. Signal blocking diodes 103 and 104 are in the normal feedback paths required for bistable operation of the master flip-flop. Diodes 105 and 106 in conjunction with AND GATE 110 and the base-emitter junction of transistors 101 establish the degree of noise immunity, known as "noise margin," of the "J" input 111. Similarly, diodes 107, 108, AND GATE 115 and the base-emitter junction of transistor 102 establish the noise margin of the "K" input 116. Although illustrated as standard diodes, diodes 105 through 108 are preferably transistors connected in a diode configuration. This configuration is 10 attainable in an integrated circuit. "J" and "K" input signals are supplied to master flip-flop 10 via input terminals 111 and 116 of AND GATES 110 and 115, respectively. Preferably, AND GATES 110 and 115 are of the type depicted in FIG. 2.

Signals developed at master flip-flop outputs 120 and 121 are supplied to control transistors 122 and 123 via limiting resistors 124 and 125, respectively. Transistors 122 and 123 in conjunction with triple-emitter transistor 130, which functions as a gate, control the conduction of the associated "current steering" transistors 140 and 141. Transistors 122 and 140 and transistors 123 and 141 form individual "current steering" transistor pairs which, in accordance with the invention, effect switching of "slave" flip-flop 20. Slave flip-flop 20 includes flip-flop switching transistors 142 and 143. Circuit paths 152 and 153 establish the necessary feedback between transistors 142 and 143 for realizing bistable operation of the slave flip-flop. Signals developed at slave outputs 150 and 151 are amplified by transistors 160 and 161, respectively, and are available at complimentary outputs 162 and 163 to be utilized as desired. Transistors 160 and 161 provide isolation between the flip-flop outputs and the slave flip-flop section.

Toggle or clock input signals for propagating signals supplied to "J" and "K" inputs 111 and 116, respectively, through the master and slave flip-flops are supplied to terminal 171 of NAND GATE 170. The output of NAND GATE 170 and 172 is supplied to input 113 of AND GATE 110, input 118 of AND GATE 115 and emitter 131 of transistor 130. Signals developed at outputs 162 and 163 are supplied to input 112 of AND GATE 110, and input 117 of AND GATE 115, respectively. This circuit configuration permits "-toggling" of the master-slave flip-flop when operated in the clocked J-K mode. That is to say, signals developed at outputs $\bar{Q}$ and Q, 162 and 163, respectively, are caused to change state once during each cycle of the toggle input. For other circuit functions or configurations, feedback paths 164 and 165 may be eliminated. The sequence of signals developed at outputs Q and $\bar{Q}$ for clocked J-K mode operation are shown in Table I.

TABLE I

| J | K | Q | $\bar{Q}$ |
|---|---|---|---|
| 0 | 0 | NC | NC |
| 1 | 0 | 1 | 0 |
| 0 | 1 | 0 | 1 |
| 1 | 1 | $Q_{n11}$* | $\bar{Q}_{n11}$* |

$\bar{Q}_{n11}$* and represent output signals developed at Q and $\bar{Q}$ after toggling that are the complements of the previous signals developed at those outputs. Thus, with high input signals representative of logic "1's" supplied to both the J and K inputs, the master-slave flip-flop functions as a binary frequency divider, the output signals developed at $\bar{Q}$ and Q, 162 and 163, respectively, being the complements of the previous signals, That is, the frequency of the output signals is half the frequency of the toggle signal supplied to input 171. Thus, an increase in the signal propagation speed through the master-slave flip-flop combination permits an increase in the toggle frequency and consequently, information may be transferred at a higher rate through, for example, a shift register or the like.

In general, system requirements dictate the input and output configurations of a master-slave flip-flop. For example, noise margin, drive power and the like, govern the master flip-flop section configuration, while output requirements control to some extent the slave flip-flop configuration. Flip-flop operation, in particular switching time, is determined primarily by the signal propagation delay within the individual flip-flop sections. This delay is generally attributed to the number of elements through which a given signal must propagate. Achievement of the system requirements of, for example, high-noise margin, low-drive power and high output power, usually involves the use of more elements which, in turn, increases propagation delay, thereby limiting switching speed.

In accordance with this invention, the switching speed of the slave flip-flop section is enhanced which, in turn, enhances switching speed of the master-slave flip-flop as a whole. This n increase in speed of operation is achieved by the use of current steering to effect changes in the state of the slave flip-flop outputs. As noted above, the conductive states of slave switching transistors 142 and 143 are regulated by current steering transistors 140 and 141, respectively, which are controlled by transistors 122 and 123 in conjunction with triple emitter transistor 130.

Switching operation of the slave flip-flop via current steering is best explained by way of an example. Thus, assume initially output 162 is at a low state, i.e., a logic "0," and complementary output 163 is at a high state, i.e., a logic "1." This first stable state of the master-slave flip-flop combination has been achieved by application of high-state signals to J, K and T inputs, namely, inputs 111, 116 and 171, respectively, and low-state signals to the S and C inputs, namely, 181 and 186, respectively. With these signals applied, master flip-flop output 120 is low and output 121 is high. Therefore, control transistor 122 is nonconducting and control transistor 123 is conducting. Correspondingly, current steering transistor 141 is nonconducting and current steering transistor 140 is conducting. Current flowing through transistor 140 is supplied for a positive supply via terminal 155 and resistors 148 and 146. This current is applied to the base of transistor 142. Consequently, transistor 142 conducts current through the circuit path including resistor 149 and circuit path 152. This current is applied to dive output buffer transistor 160. In turn, a low state output signal is developed at output 162. Transistors 141, 143 and 161 are cut off because the sustaining current flowing through resistor 149 to transistor 142 causes the potential developed at point 190 to be too low to sustain conduction of transistor 141. Since transistor 141 is cut off, so too are transistors 143 and 161, for well-known reasons.

This initial state of the master-slave flip-flop may be charged by toggling, i.e., by first supplying a low-state signal to input 171 of toggle gate 170 to "set" the master flip-flop section and isolate the master from the slave, and then supplying a high-state signal to the toggle gate to transfer the signals developed at the master flip-flop outputs into the slave flip-flop. The slave section is isolated from the master section when a low state signal is supplied to toggle input 171 because transistor 130 is cut off and consequently, transistors 122 and 123 are cut off. In this mode of operation, i.e. after the transition from a low to a high at toggle input 171, transistors 160, 142, 140 and 123 begin to turn off. The potential at point 190 increases causing transistor 141 and subsequently transistors 143 and 161 to conduct, thereby effecting a second stable state at outputs 162 and 163. Switching speed of this change of state is enhanced in accordance with the invention by causing transistor 142, which was previously sustaining conduction of transistor 160, to "turn off" more rapidly. This is accomplished in accordance with this invention by drawing excess base charge away from transistor 142 via transistor 140 and 122. In this instance, transistor 140.functions as an inverted transistor and conducts the charge away from the base of transistor 142 through transistor 122 and transistor 130.

In addition to the improved propagation characteristics described above, lower drive power requirements are achieved in the invention by use of gates for the set, clear and toggle inputs, namely, NAND GATES 180, 185 and 170, respectively. Preferably these gates take the form illustrated in FIG. 3, and are fabricated on the master-slave flip-flop silicon chip.

Limitations on silicon chip size restrain circuit complexity, since the number of elements which may be used is limited because of the need for isolation and separation. Thus, another feature of the invention is that each of the current steering transistor pairs, namely, transistors 122 and 140, and transistor 123 and 141, occupies a single isolation region on the monolithic chip. This is achieved by utilizing a dual transistor configuration having a common collector region of the current steering transistor pair.

Set signal clear operation of the master-slave flip-flop is achieved by application of appropriate signals to S and C inputs, 181 and 186, respectively. For example, application of a low state signal to input 181 and a high-state signal to input 186 causes output $\bar{Q}$, i.e., 162 to assume a high-state and Q, i.e., 163 to assume a low-state. The low-state signal applied to gate 180 causes its output to represent a high-state signal. This signal is applied to emitter 132 of transistor 130 and diode 182. The high-state signal applied to gate 185 causes its output to represent a low-state signal. This low signal is applied to emitter 133 of transistor 130 and diode 187. Thus, the output of gate 185 causes transister 130 to conduct and output 121 of master flip-flop 10 to assume a low state. Consequently, master flip-flop output 120 goes high and, in turn, transistor 122 conducts and 123 turns off. The slave flip-flop switching progresses as previously described and outputs $\bar{Q}$ and Q, 162 and 163, respectively, achieve the appropriate output conditions, namely, 162 is high and 163 is low. This mode of operation, i.e., asynchronous is set forth in Table II.

TABLE II

| S | C | Q | $\bar{Q}$ |
|---|---|---|---|
| 0 | 0 | NC | NC |
| 1 | 0 | 1 | 0 |
| 0 | 1 | 0 | 1 |
| 1 | 1 | * | * |

The asterisk (*) indicates an indeterminate state.

Synchronous operation of the master-slave flip-flop is set forth in Table III.

TABLE III

| JKSC | Q | $\bar{Q}$ | Q | $\bar{Q}$ |
|---|---|---|---|---|
| Initial State | 0 | 1 | 1 | 0 |
| 0000 | 0 | 1 | 1 | 0 |
| 0100 | 0 | 1 | 0 | 1 |
| 1100 | 1 | 0 | 0 | 1 |
| 1000 | 1 | 0 | 1 | 0 |
| 0001 | 0 | 1 | 0 | 1 |
| 0101 | 0 | 1 | 0 | 1 |
| 1101 | 0 | 1 | 0 | 1 |
| 1001 | 0 | 1 | 0 | 1 |
| 0010 | 1 | 0 | 1 | 0 |
| 0110 | 1 | 0 | 1 | 0 |
| 1110 | 1 | 0 | 1 | 0 |
| 1010 | 1 | 0 | 1 | 0 |
| 0011 | * | * | * | * |
| 0111 | * | * | * | * |
| 1111 | * | * | * | * |
| 1011 | * | * | * | * |

* indicates an indeterminate state.

Table III illustrates flip-flop output conditions, after toggling, for signals supplied to J, K, S and C inputs 111, 116, 181, and 186, respectively, for the sets of initial conditions at Q and $\bar{Q}$ outputs 163 and 162, respectively, of Q–"0" and $\bar{Q}$–"1," and Q–"1" and $\bar{Q}$–"0."

Figure 2:
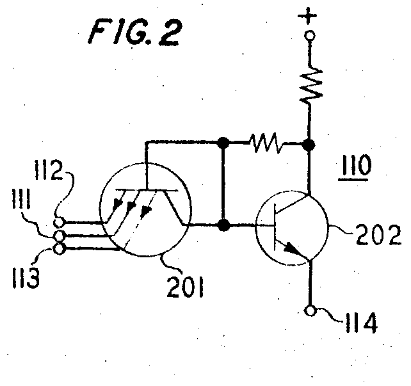
FIG. 2 shows details of one logic state used in the flip-flop of FIG. 1.

FIG. 2 shows details of NA AND GATES 110 and 115 of FIG. 1. Operation of gate 110 is straightforward. For example, application of a high-state signal to each of inputs 111, 112, and 113 causes transistor 201 to be "cut off" and transistor 202 to conduct in well-known fashion; a signal is developed at terminal 114 which is representative of a high state. Application of a low-state signal to either, or all, of inputs 111, 112 or 113 causes transistor 201 to conduct and hence transistor 202 to be cut off.

Figure 3:
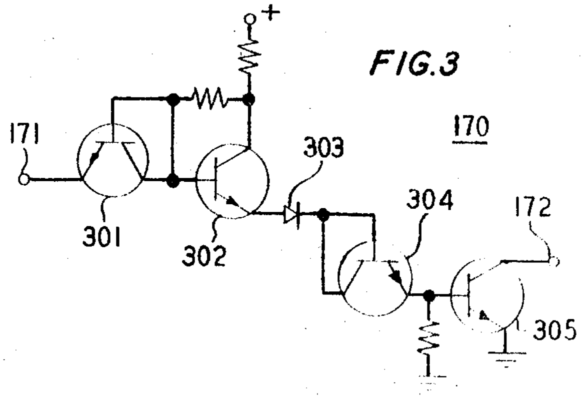
FIG. 3 shows another logic gate used in the flip-flop of FIG. 1.

FIG. 3 shows details of NAND GATES 170, 180 and 185 of FIG. 1. Operation of gate 170 is starightforward; a high-state signal supplied to input 171 causes transistor 301 to be cut off and transistor 302 to conduct. Consequently, a condition is developed at terminal 172 which represents a low state. Conversely, application of a low-state signal to input 171 causes a condition to be developed in well-known fashion at terminal 172 which represents a high state.

I claim:

1. A bistable circuit which comprises:

a master flip-flop section having first and second stable states and first and second outputs at which signals representative of said stable states are developed in response to selected input signals;

a slave flip-flop section having first and second stable states and first and second outputs at which signals representative of said stable states are developed, said slave flip-flop section including a first switching section and a second switching section each having an input and an output;

current steering means for selectively coupling said master flip-flop section and said slave flip-flop section, said current steering means including a first transistor pair and a second transistor pair, said first transistor pair being in circuit relationship with the input of said first switching section, the output of said second switching section and the first output of said master flip-flop section, and said second transistor pair being in circuit relationship with the input of said second switching section, the output of said first switching section and the second output of said master flip-flop section;

control means in circuit relationship with said first and second transistor pairs and being responsive to selected signal states for initiating a change of state of said slave flip-flop section, said first and second transistor pairs being selectively responsive to states of said control means and to said signals developed at the outputs of said master flip-flop section for selectively switching said slave flip-flop section from one stable state to another stable state.

2. A bistable circuit as defined in claim 1 wherein said control means is a unidirectional conductive element.

3. A circuit as defined in claim 1 wherein said current steering transistor pairs each includes a dual transistor having first and second emitter regions, first and second base regions and a common collector region thereby to save space on an integrated circuit monolithic substrate.

4. A circuit as defined in claim 1 wherein said first switching section and said second switching section of said slave flip-flop each includes a transistor having a base, emitter and collector; and said first and second transistor pairs each includes a first transistor having a base, emitter and collector and a second transistor having a base, emitter and collector, said collectors being common to said first and second transistors of said transistor pairs, the emitter of the first transistor of said first transistor pair being connected to the base of said first switching section transistor the base of the first transistor of said first transistor pair being in circuit relationship with the collector of said second switching section transistor, the emitter of the first transistor of said second transistor pair being connected to the base of said second switching section transistor, the base of the first transistor of said second transistor pair being in circuit relationship with the collector of said first switching section transistor, the base of the second transistor of said first transistor pair being in circuit relationship with the first output of said master flip-flop, the base of the second transistor of said second transistor pair being in circuit relationship with the second output of said master flip-flop, and the emitters of the second transistors of said first and second transistor pairs being in circuit relationship with said control means.

5. A bistable circuit which comprises:

a master flip-flop having first and second stable states of operation and first and second outputs at which signals representative of said stable states are developed in response to input signals in a selected code;

a slave flip-flop including first and second switching sections each having mutually exclusive first and second stable states of operation and an output at which signals representative of said stable states are developed, each of said first and second switching sections including a transistor having a base, an emitter and a collector;

a first current steering transistor pair in circuit relationship with said first switching section and the first output of said master flip-flop, said first transistor pair including a first transistor having a base, an emitter and a collector and a second transistor having a base, an emitter and a collector, said collectors being common to said first and second transistors, the emitter of said first transistor being connected to the base of said first switching section transistor, the base of said first transistor being in circuit relationship with the collector of said second switching section transistor, and the base of said second transistor being in circuit relationship with the first output of said master flip-flop;

a second current steering transistor pair in circuit relationship with said second switching section and the second output of said master flip-flop, said second transistor pair including a first transistor having a base, an emitter and a collector and a second transistor having a base, an emitter and a collector, said collectors being common to said first and second transistors, the emitter of said first transistor being connected to the base of said second switching section transistor, the base of said first transistor being in circuit relationship with the collector of said first switching section transistor, and the base of said second transistor being in circuit relationship with the second output of said master flip-flop; and control means in circuit relationship with the emitters of the second transistor of said first and second current steering transistor pairs, said control means being responsive to selected states of applied signals for initiating a change of state of said slave flip-flop sections, said second transistors of said current steering transistor pairs being selectively responsive to signals developed at said master flip-flop outputs and to states of conduction of said control means for causing said slave flip-flop sections to switch from one stable state to another stable state.

6. A bistable circuit as defined in claim 5 wherein said control means is a unidirectional conductive element.

7. A circuit as defined in claim 5 wherein said control means is a transistor having a base terminal, a collector terminal and at least one emitter terminal, said base and collector terminals being in circuit relationship with the emitters of said second transistors of said first and second current steering transistor pairs, and said control means transistor being conductively responsive to signal states applied to said at least one emitter terminal.

8. A circuit as defined in claim 5 wherein said current steering transistor pairs each comprises a dual transistor structure having first and second emitters, first and second bases and a common collector.